(12) United States Patent
She et al.

(10) Patent No.: US 11,597,686 B2
(45) Date of Patent: *Mar. 7, 2023

(54) METHOD FOR FABRICATING CERAMIC MATRIX COMPOSITE COMPONENTS

(71) Applicant: Raytheon Technologies Corporation, Farmington, CT (US)

(72) Inventors: Ying She, Hartford, CT (US); Rajiv Ranjan, South Windsor, CT (US); Zissis A. Dardas, Worcester, MA (US); Gajawalli V. Srinivasan, South Windsor, CT (US); Lesia V. Protsailo, Bolton, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/025,544

(22) Filed: Sep. 18, 2020

(65) Prior Publication Data

US 2021/0002766 A1 Jan. 7, 2021

Related U.S. Application Data

(63) Continuation of application No. 15/687,625, filed on Aug. 28, 2017, now Pat. No. 10,801,108.

(51) Int. Cl.
*C23C 16/04* (2006.01)
*C04B 35/80* (2006.01)
(Continued)

(52) U.S. Cl.
CPC ............ *C04B 35/80* (2013.01); *C04B 35/515* (2013.01); *C04B 35/565* (2013.01);
(Continued)

(58) Field of Classification Search
CPC ............ C23C 16/045; C23C 16/45544; C04B 35/806; C04B 35/62868
See application file for complete search history.

(56) References Cited

U.S. PATENT DOCUMENTS 6,743,393 B1 6/2004 Petrak
7,297,368 B2 11/2007 Williams et al.
(Continued)

FOREIGN PATENT DOCUMENTS

CN 10253449 7/2012
CN 10701162 A * 8/2017 ............. C04B 41/85
(Continued)

OTHER PUBLICATIONS

Maille, Laurence, et al., "Ceramic matrix composites manufactured by multistep densification of Si—O—C fibre preform". Ceramic Transactions, American Ceramic Society, 2014, 244, pp. 61-69.*
(Continued)

*Primary Examiner* — Bret P Chen
(74) *Attorney, Agent, or Firm* — Carlson, Gaskey & Olds, P.C.

(57) ABSTRACT

A method for fabricating a component according to an example of the present disclosure includes the steps of depositing a stoichiometric precursor layer onto a preform, and densifying the preform by depositing a matrix material onto the stoichiometric precursor layer. An alternate method and a component are also disclosed.

15 Claims, 4 Drawing Sheets

(51) Int. Cl.
  *C23C 16/455* (2006.01)
  *H01L 21/02* (2006.01)
  *C04B 35/628* (2006.01)
  *C04B 35/565* (2006.01)
  *C04B 35/515* (2006.01)
  *C01B 32/956* (2017.01)

(52) U.S. Cl.
  CPC ...... *C04B 35/62868* (2013.01); *C23C 16/045* (2013.01); *C23C 16/45544* (2013.01); *H01L 21/02529* (2013.01); *C01B 32/956* (2017.08); *C04B 2235/614* (2013.01)

(56) References Cited

U.S. PATENT DOCUMENTS

| | | | | |
|---|---|---|---|---|
| 9,581,039 | B2* | 2/2017 | Renon | D03D 23/00 |
| 10,801,108 | B2* | 10/2020 | She | C23C 16/045 |
| 2004/0207133 | A1* | 10/2004 | Williams | C04B 35/56 264/640 |
| 2005/0276961 | A1 | 12/2005 | Sherwood et al. | |
| 2006/0035024 | A1* | 2/2006 | Landini | C04B 35/80 427/350 |
| 2006/0163773 | A1* | 7/2006 | Gray | C04B 35/80 264/270 |
| 2006/0283014 | A1 | 12/2006 | Subramanian | |
| 2009/0014756 | A1 | 1/2009 | Singh et al. | |
| 2010/0151676 | A1 | 6/2010 | Ritchie | |
| 2010/0284810 | A1* | 11/2010 | Corman | B29C 70/20 264/44 |
| 2012/0164430 | A1* | 6/2012 | Thebault | C04B 35/62863 428/293.4 |
| 2013/0167374 | A1 | 7/2013 | Kirby et al. | |
| 2013/0323417 | A1* | 12/2013 | Kmetz | C04B 35/589 427/226 |
| 2014/0193577 | A1* | 7/2014 | Monaghan | C04B 35/565 264/258 |
| 2014/0271161 | A1* | 9/2014 | Lazur | C04B 35/62868 428/221 |
| 2016/0102022 | A1* | 4/2016 | Chamberlain | C04B 35/62897 423/263 |
| 2016/0107940 | A1 | 4/2016 | Lazur | |
| 2016/0159701 | A1 | 6/2016 | Lazur | |
| 2017/0101873 | A1* | 4/2017 | Morgan | C04B 35/573 |
| 2019/0284099 | A1* | 9/2019 | Jackson | C04B 35/80 |
| 2020/0027580 | A1* | 1/2020 | Deck | B32B 18/00 |
| 2021/0002766 | A1* | 1/2021 | She | C04B 35/515 |

FOREIGN PATENT DOCUMENTS

| | | | |
|---|---|---|---|
| EP | 0515186 | 11/1992 | |
| EP | 2933353 | 10/2015 | |
| EP | 3130575 A2 * | 2/2017 | ........... C04B 35/565 |
| WO | 2007147946 | 12/2007 | |
| WO | WO 2007/147946 A1 * | 12/2007 | ........... C03B 37/018 |
| WO | WO 2014/150394 A3 * | 9/2014 | ........... C04B 35/565 |

OTHER PUBLICATIONS

Jones, R., et al., "Polymer derived ceramic matrix composites". Composites: Part A (1999) 569-575.*

Qi, Gong-jin, et al., "PIP preparation of silica fibre fabric reinforced silicon nitride-based composites using polyhydridomethylsilazane". Advanced Composites Letters, vol. 14, No. 4, 2005, pp. 129-132.*

Taillet, Brice, et al., "Densification of Ceramic Matrix Composite Preforms by Si2N2O Formed by Reaction of Si with SiO2 under High Nitrogen Pressure. Part 1: Materials Synthesis". Journal of Composites Science, 2021, 5, 178, pp. 1-36.*

Taillet, Brice, et al., "Densification of Ceramic Matrix Composite Preforms by Si2N2O Formed by Reaction of Si with SiO2 under High Nitrogen Pressure. Part 1: Materials Synthesis". Journal of Composites Science, 2021 5(7) 178, pp. 1-36.*

Yang, J.-M., "Processing of Metal and Ceramic Matrix Composites with three-dimensional braided reinforcement". Advanced Materials and Manufacturing Processes, vol. 3, 1998 Issue 2, 1 page. Abstract Only.*

Nakazato, Naofumi, et al., "Effects of Pressure during Preform Densification on SiC/SiC Composites". Open Journal of Inorganic Non-metallic Materials, 2013, 3, 10-13.*

Nidha, Vikas, et al., "A Two-Dimensional Model of Chemical Vapor Infiltration with Radio-Frequency Heating". 'J. Electrochem. Soc., vol. 145, No. 10, Oct. 1998, pp. 3569-3580.*

Patentability Search Report, conducted by MDP Research Inc. dated Jul. 3, 2017.

European Search Report for European Application No. 18191322.9 dated Dec. 17, 2018.

Wan, Yimao, et al., "Characterisation and optimisation of PECVD SiNx as an antireflection coating and passivation layer for silicon solar cells". AIP Advances 3, 032113 (2013), pp. 1-14.

Mainzer, Bernd, et al., "Development of wound SiCBNx/SiNx/SiC with near stoichiometric SiC matrix via LSI process". Journal of the European Ceramic Society 36 (2016) pp. 1571-1580.

* cited by examiner

METHOD FOR FABRICATING CERAMIC MATRIX COMPOSITE COMPONENTS

CROSS REFERENCE TO RELATED APPLICATION

This application is a continuation of U.S. application Ser. No. 15/687,625 filed on Aug. 28, 2017, now U.S. patent Ser. No. 10/801,108.

BACKGROUND

This disclosure relates to a method of fabricating components, and in particular, ceramic matrix composite (CMC) components.

CMC components typically comprise ceramic reinforcements, such as fibers, in a ceramic matrix phase. CMC components can withstand high temperatures and oxidative environments due to their material properties, high strength and creep resistance, high thermal conductivity, and relatively low weight. An example CMC component comprises silicon carbide reinforcement embedded in a silicon carbide matrix material.

Various techniques are used to fabricate CMC components. For example, a preform comprising reinforcements is infiltrated with a matrix material. The composition of the matrix material affects the properties of the CMC component. In turn, the composition of the matrix material can be influenced by the method of depositing the matrix material onto the preform.

SUMMARY

A method for fabricating a component according to an example of the present disclosure includes the steps of depositing a stoichiometric precursor layer onto a preform, and densifying the preform by depositing a matrix material onto the stoichiometric precursor layer.

In a further embodiment according to any of the foregoing embodiments, the preform comprises silicon carbide fibers.

In a further embodiment according to any of the foregoing embodiments, the stoichiometric precursor layer is silicon carbide, and wherein the ratio of silicon to carbon in the stoichiometric precursor layer is approximately one.

In a further embodiment according to any of the foregoing embodiments, the matrix material is silicon carbide and has a ratio of silicon atoms to carbon atoms, and the ratio is approximately one.

In a further embodiment according to any of the foregoing embodiments, the step of depositing the stoichiometric precursor layer onto the preform is accomplished by an atomic layer deposition process.

In a further embodiment according to any of the foregoing embodiments, the step of densifying the preform is accomplished by a chemical vapor infiltration process.

In a further embodiment according to any of the foregoing embodiments, the matrix material comprises one or more constituents, and the method further comprises the steps of determining the ratio of the one or more constituents to one another, and comparing the ratio to the stoichiometric ratio of the matrix material.

In a further embodiment according to any of the foregoing embodiments, the depositing step and the densifying step are performed in the same reactor.

Another method of fabricating a component according to an example of the present disclosure includes the steps of arranging one or more preforms in a reactor, providing a silicon-containing precursor to the reactor such that the silicon-containing precursor adsorbs onto the one or more preforms, providing a carbon-containing precursor to the reactor such that the carbon-containing precursor reacts with the silicon-containing precursor to form a stoichiometric precursor layer, wherein the ratio of silicon atoms to carbon atoms in the stoichiometric precursor layer is approximately one, and providing at least one silicon carbide precursor to the reactor to densify the one or more preforms by depositing a silicon carbide matrix onto the stoichiometric precursor layer.

In a further embodiment according to any of the foregoing embodiments, the silicon carbide matrix has a ratio of silicon atoms to carbon atoms, and the ratio is approximately one.

In a further embodiment according to any of the foregoing embodiments, the silicon-containing precursor includes one of $Cl_2SiH_2$, $SiH_4$, $ClSiH_3$, and $Si_2H_6$ and the carbon-containing precursor includes one of $CH_4$ (methane), $C_2H_6$ (ethane), $C_3H_8$ (propane), $C_2H_2$ (acetylene), and $C_2H_4$ (ethylene).

In a further embodiment according to any of the foregoing embodiments, the at least one silicon carbide precursor includes a first precursor and a second precursor, and the first precursor is methyltrichlorosilane (MTS) and the second precursor is hydrogen ($H_2$).

In a further embodiment according to any of the foregoing embodiments, the method further comprises the step of vacuuming the reactor after the step of providing the silicon-containing precursor to the reactor to remove excess silicon-containing precursor from the reactor.

In a further embodiment according to any of the foregoing embodiments, the method further comprises the step of vacuuming the reactor after the step of providing the carbon-containing precursor to the reactor to remove excess carbon-containing precursor from the reactor.

In a further embodiment according to any of the foregoing embodiments, wherein the reactor includes an exhaust valve, and wherein the exhaust valve is closed during the step of providing the silicon-containing precursor to the reactor and the step of providing the carbon-containing precursor to the reactor, and the exhaust valve is open during the step of providing at least one silicon-carbide precursor to the reactor.

In a further embodiment according to any of the foregoing embodiments, the one or more preforms comprise silicon carbide fibers.

In a further embodiment according to any of the foregoing embodiments, the silicon carbide fibers are coated with a boron nitride interfacial coating.

In a further embodiment according to any of the foregoing embodiments, the silicon carbon fibers have a unidirectional orientation with respect to one another.

In a further embodiment according to any of the foregoing embodiments, further including the step of determining the ratio of silicon atoms to carbon atoms in the silicon carbide matrix, and comparing the ratio to one.

A ceramic matrix composite component according to an example of the present disclosure is formed by a process comprising the steps of depositing a stoichiometric precursor layer onto a preform and densifying the preform by depositing a matrix material onto the stoichiometric precursor layer.

DETAILED DESCRIPTION

Figure 1A:
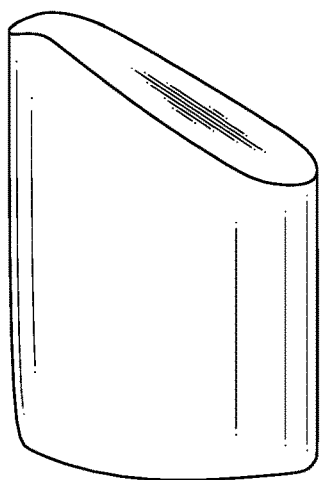
FIG. 1A schematically shows a ceramic matrix composite (CMC) component.
Figure 1B:
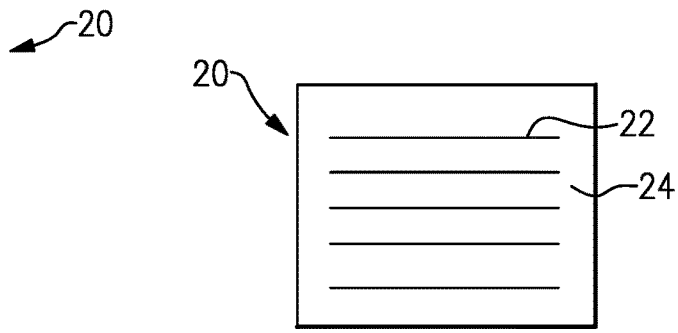
FIG. 1B schematically shows a close-up view of the CMC component.

FIGS. 1A-1B schematically illustrate a ceramic matrix composite (CMC) component 20 for hot sections of gas turbine engines, which operate at temperatures greater than 2000° F. (1093.33° C.). In the example of FIG. 1, the component 20 is a blade or vane for a turbine. However, in other examples, component 20 can be another part of a gas turbine engine, such as a combustor panel, a blade outer air seal, or another type of component.

CMC component 20 includes ceramic reinforcements 22, such as fibers, embedded in a ceramic matrix material 24. In the example of FIG. 1, the fibers 22 are arranged unidirectional with respect to one another. However, in other examples, the fibers 22 can have other orientations, or have random orientations. In a particular example, fibers 22 are silicon carbide fibers and matrix 24 is silicon carbide as well. In some examples, fibers 22 include a coating, such as a boron nitride interfacial coating.

Figure 2:
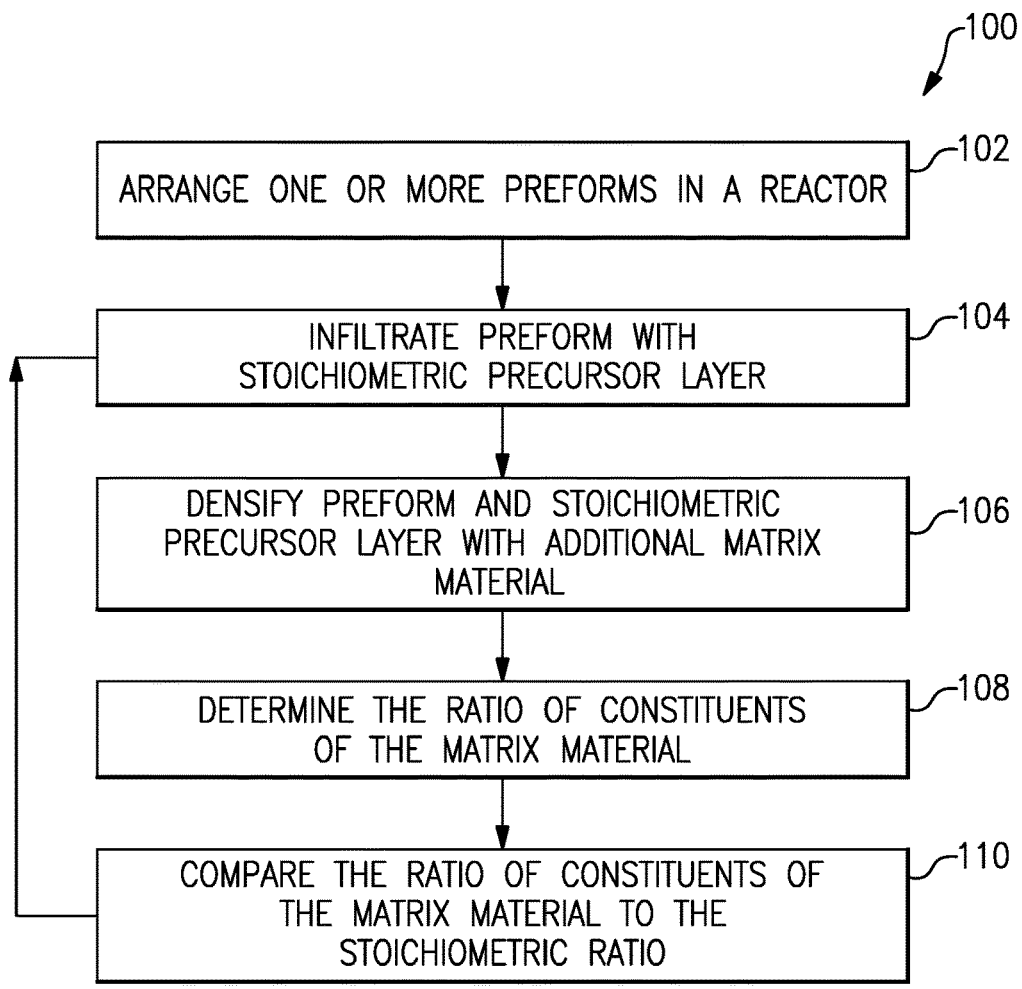
FIG. 2 schematically shows a method of fabricating the CMC component.
Figure 3:
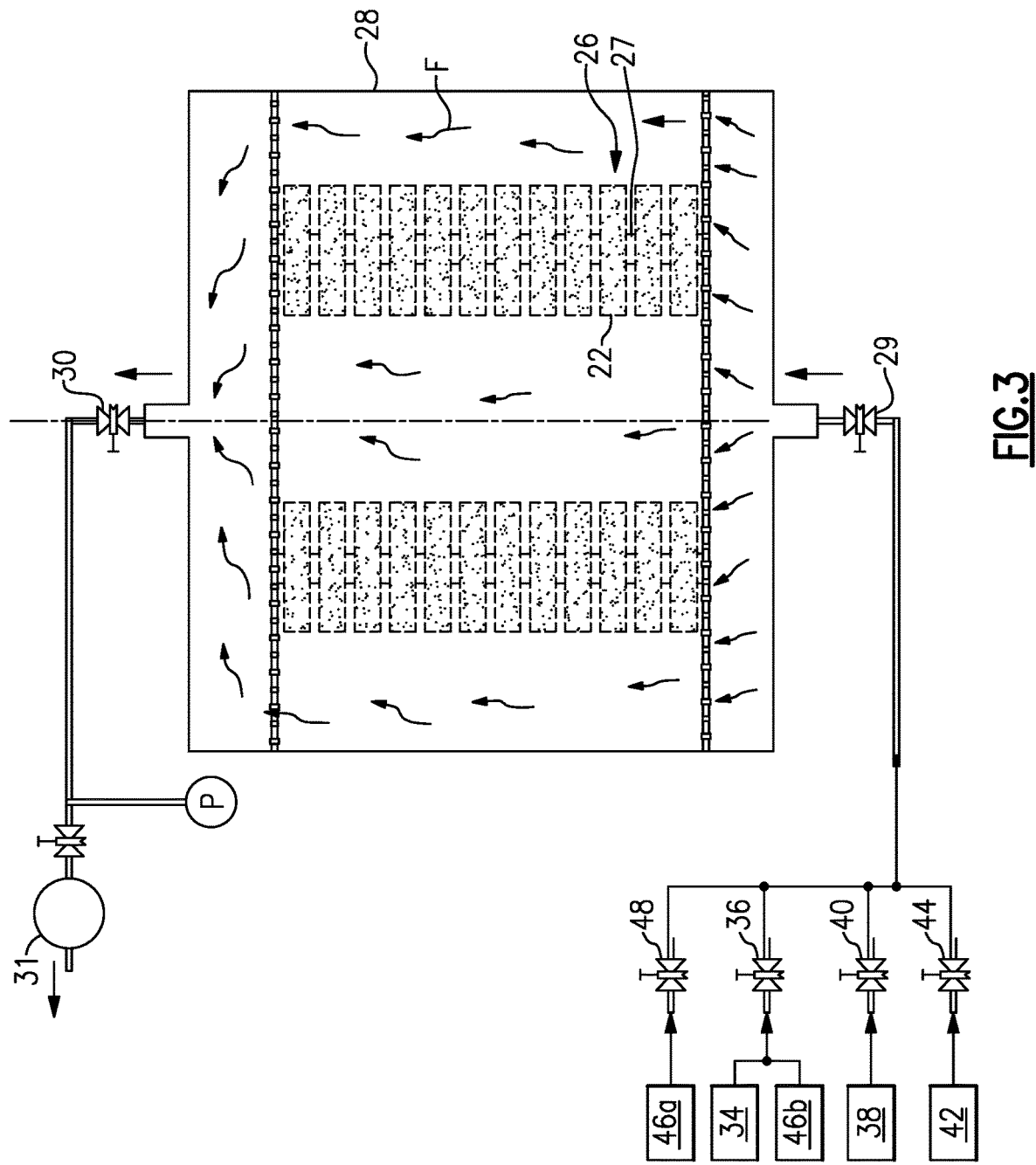
FIG. 3 schematically shows a furnace for fabricating the CMC component.

FIG. 2 shows a method 100 of fabricating the CMC component 20. In step 102, one or more preforms 26 are arranged in a reactor 28, as shown in FIG. 3. The reactor 28 generally includes an inlet valve 29 to control inlets to the reactor 28 and an exhaust valve 30 to control exhaust from the reactor 28. A vacuum pump 31 controls the pressure in the reactor 28.

The preforms 26 comprise fibers 22 and are generally porous. In the example of FIG. 3, multiple preforms 26 are loaded to the reactor 28 and are stacked, with spacers 27 separating each preform 26 from adjacent preforms 26. In another example, preforms 26 can be arranged within reactor 28 in another way. In yet another example, only a single preform 26 is loaded to the reactor 28. For ease of reference, a single preform 26 will be referred to in the foregoing description.

Figure 4:
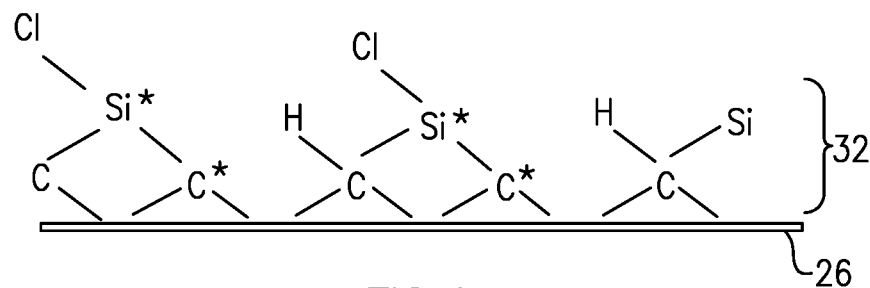
FIG. 4 schematically shows a CMC component during fabrication.

In step 104, a stoichiometric precursor layer 32 is infiltrated into the preform 26, as shown in FIG. 4. A stoichiometric material such as the stoichiometric precursor material has a ratio of atomic constituents that is approximately the same as the ratio of constituents expressed in its chemical formula. For instance, stoichiometric silicon carbide (SiC) has a ratio of silicon atoms to carbon atoms that is equal to approximately one. Silicon carbide with a ratio of silicon atoms to carbon atoms that is substantially equal to one (i.e., "stoichiometric silicon carbide") exhibits improved temperature and oxidation resistance, as well as high thermal conductivity and high strength and creep resistance as compared to silicon carbide with a ratio of silicon atoms to carbon atoms that is substantially less than or greater than one. This is partially due to improved material uniformity. Additionally, if silicon carbide has a ratio of silicon atoms to carbon atoms greater than one, the silicon carbide has excess silicon and exhibits lowered melting temperature and lowered oxidation resistance. Likewise, if silicon carbide has a ratio of silicon atoms to carbon atoms less than one, the silicon carbide has excess carbon and exhibits decreased temperature and oxidation resistance. Though in this example, the stoichiometric precursor layer 32 is silicon carbide, it should be understood that in other examples, the stoichiometric precursor layer 32 is another stoichiometric material.

Figure 5:
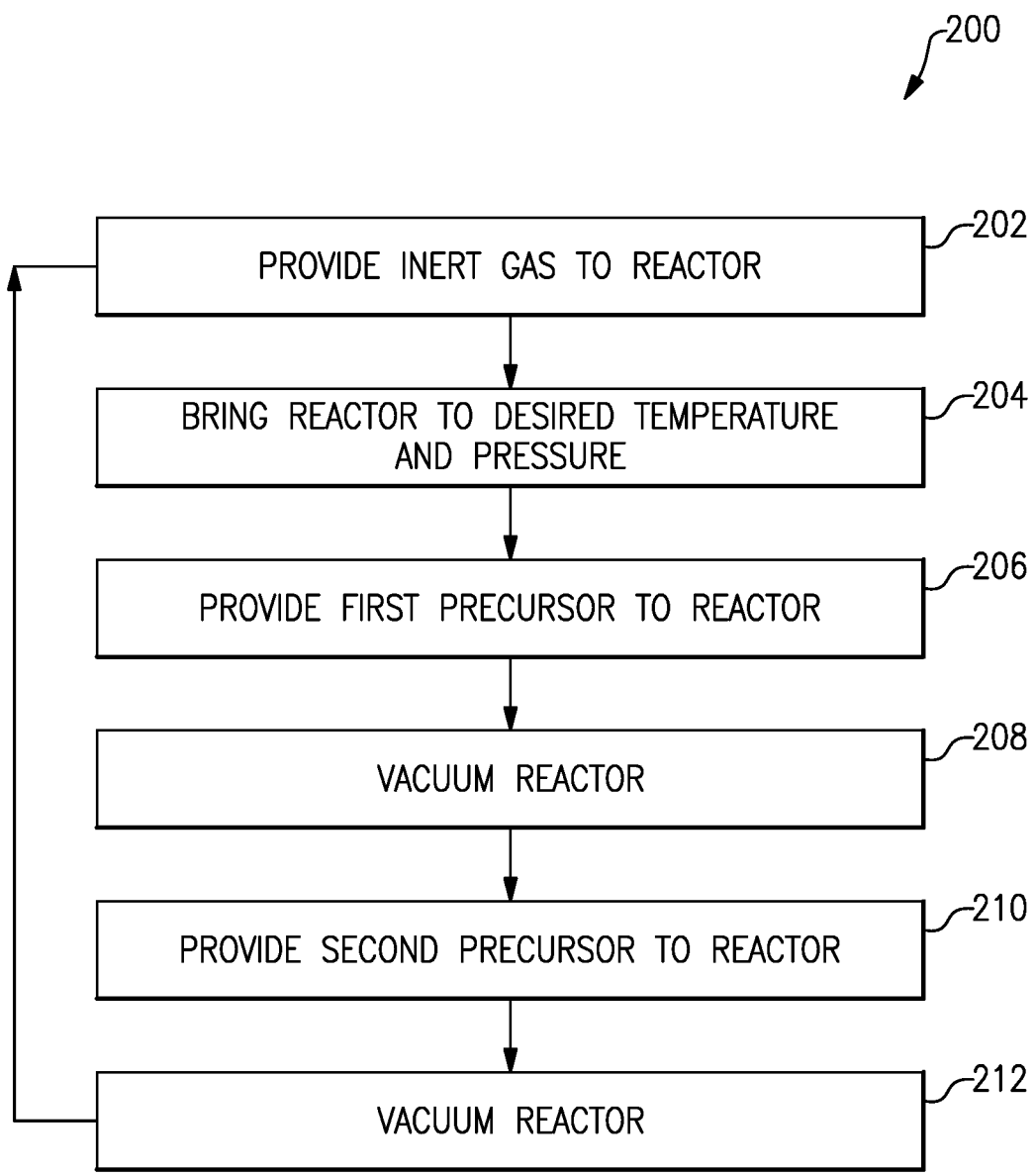
FIG. 5 schematically shows a method depositing a stoichiometric precursor layer onto a preform.

In one example, the stoichiometric precursor layer 32 is deposited into the one or more preforms 26 by an atomic layer deposition (ALD) process. In a particular example an atomic layer epitaxy (ALE) process is used. An ALE process 200 is shown in FIG. 5. In step 202, a gas 34 that is inert is provided to the reactor 28 by opening valve 36.

In step 204, the reactor 28 is then brought to a desired temperature T1 and a desired pressure P1. The desired temperature T1 and pressure P1 depend on selected and used precursors and the desired stoichiometric precursor layer 32. In one example, where the desired stoichiometric precursor layer 32 is silicon carbide, the desired temperature T1 is about 1832° F. (1000° C.) and the desired pressure P1 is about 0.3 torr (40 Pa).

In step 206, a first precursor 38 is provided to the reactor 28 by opening valve 40. At the same time, valve 36 is closed to stop the flow of gas 34 into the reactor 28 and exhaust valve 30 is closed to keep the first precursor 38 in the reactor 28. In one example, step 206 is performed in approximately ten seconds or less. The first precursor infiltrates into and adsorbs on the surfaces of the preform 26. For the silicon carbide stoichiometric precursor layer 32 discussed above, the first precursor is a silicon-containing precursor and the second precursor is a carbon-containing precursor. Example silicon-containing precursors are $Cl_2SiH_2$, $SiH_4$, $ClSiH_3$, and $Si_2H_6$. Example carbon-containing precursors are $CH_4$ (methane), $C_2H_6$ (ethane), $C_3H_8$ (propane), $C_2H_2$ (acetylene), and $C_2H_4$ (ethylene). However, if another stoichiometric precursor layer 32 is being formed, other precursors containing the elements of the desired stoichiometric precursor layer 32 would be used. At the end of step 206, valve 40 is closed to stop the flow of the first precursor 38 into the reactor 28.

In step 208, the reactor 28 is vacuumed by vacuum pump 31 by opening exhaust valve 30 to remove excess first precursor 38 from the reactor 28. In one example, step 208 is performed for approximately between ten and 60 seconds.

In step 210, a second precursor 42 is provided to the reactor 28 by opening valve 44. At the same time, exhaust valve 30 is closed to keep the second precursor 42 in the reactor 28. During step 210, the precursors 38, 42 form the stoichiometric precursor layer 32 (i.e., a layer 32 with a ratio of silicon atoms to carbon atoms of approximately one). In the example of a silicon carbide stoichiometric precursor layer 32, the second precursor 42 is a carbon-containing precursor and infiltrates the preform 26 to form the silicon carbide, such that the ratio of silicon atoms to carbon atoms on the preform 26 is approximately one. In one example, step 210 is performed in approximately ten seconds or less. At the end of step 210, valve 44 is closed to stop the flow of the second precursor 42 into the reactor 28. For example, silicon and carbon from the precursors 38, 42 form a silicon carbide stoichiometric precursor layer, as shown in FIG. 4. In one example, the first precursor 38 is the silicon-containing precursor and the second precursor 42 is the carbon-containing precursor.

In step 212, the reactor 28 is vacuumed by pump 31 by opening exhaust valve 30 to remove the second precursor 42 from the reactor 28. In one example, step 212 is performed for approximately between ten and 60 seconds.

Steps 206-212 can optionally be repeated one or more times to build up the stoichiometric precursor layer 32.

Referring again to FIG. 2, in step 106, the component 20 is densified by depositing matrix material 24 onto the stoichiometric precursor layer 32. The matrix material 24 is the same material as the stoichiometric precursor layer 32. The stoichiometric precursor layer 32 favors improved yield and deposition of a generally stoichiometric matrix material 24 in step 106. This is because reactions occurring at the surface of the preform 26 tend to mimic the existing surface chemistry of the stoichiometric precursor layer 32 to mitigate the stacking faults. Therefore, the matrix material 24 is generally stoichiometric and exhibits improved properties as described above.

In one example, steps 104-106 are repeated one or more times. For instance, after partially densifying the preform 26 in step 106, the ratio of the constituents of the matrix material 24 is determined via x-ray or another type of spectroscopy in optional step 108. Then, the ratio of constituents is compared to the stoichiometric ratio in step 110. If the ratio differs from the stoichiometric ratio, another stoichiometric precursor layer 32 is infiltrated into the preform 26 as in step 104. The preform 26 is then densified again as in step 106. The further densification results in a generally stoichiometric matrix material 24 as described above.

Figure 6:
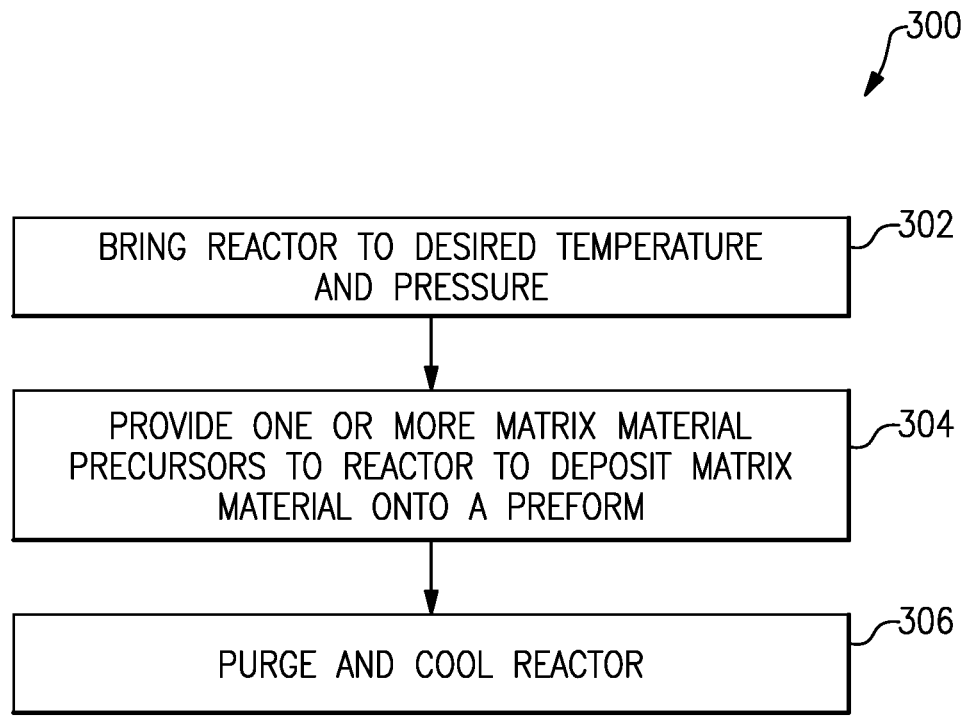
FIG. 6 schematically shows a method of densifying a preform with a stoichiometric precursor layer to form a CMC component.

In one example, the densifying in step 106 is performed by a chemical vapor infiltration process 300, as shown schematically in FIG. 6.

In step 302, the reactor 28 is brought to a desired temperature T2 and pressure P2. For example, for the deposition of silicon carbide matrix material 24 with precursors methyltrichlorosilane (MTS) and hydrogen ($H_2$), as will be discussed below, the reactor is brought to a temperature T2 of approximately 1922° F. (1050° C.) and a pressure P2 10 torr (1333.22 Pa). In another example, the temperature T2 in process 300 is greater than the temperature T1 in process 200, and the pressure P2 in process 300 is greater than the pressure P1 in process 200.

Figure 7:
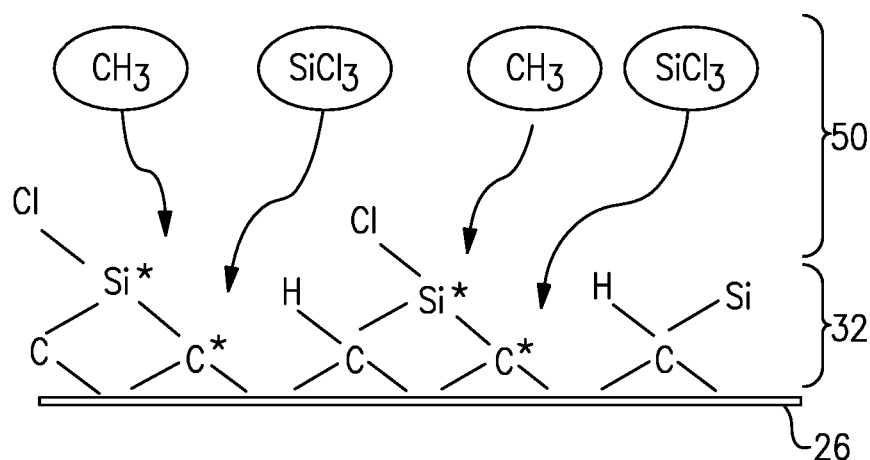
FIG. 7 schematically shows a CMC component during the densifying step.

In step 304, one or more matrix material precursors 46a, 46b are provided to the reactor 28. Exhaust valve 30 remains open to allow for continuous flow of matrix material precursors 46a, 48b through the reactor 28, as shown by arrows F. For a silicon carbide matrix material 24, example precursors 46a, 46b are methyltrichlorosilane (MTS) and hydrogen ($H_2$). In this example, during step 304, MTS breaks down into gaseous $CH_3$ and $SiCl_3$ free radicals 50, as shown in FIG. 7, which adsorb onto the stoichiometric precursor layer 32 to react for the formation of silicon carbide deposit, in generally stoichiometric amounts to create a generally stoichiometric silicon carbide matrix material 24. Step 304 is performed until a desired density of the component 20 is achieved.

In one example, MTS is provided to the reactor 28 by opening valve 48 and hydrogen is provided to the reactor 28 by valve 36, the same valve that controls flow of inert gas 34 to the reactor 28. In another example, a separate valve is used for hydrogen or another matrix material precursor.

In step 306, the reactor 28 is purged by closing valve 48 to stop the flow of matrix material precursor 46a into the reactor 28 and providing inert gas 34 to the reactor 28 via valve 36. In step 306, the reactor 28 is also cooled.

Though steps 104 and 106 are described above as being performed in the same furnace, in another example, steps 104 and 106 can be performed in separate furnaces.

Furthermore, the foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A method of fabricating a component, comprising the steps of:
    depositing a stoichiometric precursor layer onto a preform; and
    densifying the preform by depositing a matrix material onto the stoichiometric precursor layer, wherein the matrix material is the same material as the stoichiometric precursor material.

2. The method of claim 1, wherein the preform comprises silicon carbide fibers.

3. The method of claim 1, wherein the stoichiometric precursor layer is silicon carbide, and wherein a ratio of silicon to carbon in the stoichiometric precursor layer is approximately one.

4. The method of claim 3, wherein the matrix material is silicon carbide and has a ratio of silicon atoms to carbon atoms, and the ratio is approximately one.

5. The method of claim 1, wherein the step of depositing the stoichiometric precursor layer onto the preform is accomplished by an atomic layer deposition process.

6. The method of claim 1, wherein the step of densifying the preform is accomplished by a chemical vapor infiltration process.

7. The method of claim 1, wherein the matrix material comprises one or more constituents, and further comprising the steps of:
    determining a ratio of the one or more constituents to one another; and
    comparing the ratio to the stoichiometric ratio of the matrix material.

8. The method of claim 1, wherein the depositing step and the densifying step are performed in the same reactor.

9. The method of claim 2, wherein the silicon carbide fibers have a unidirectional orientation with respect to one another.

10. The method of claim 1, further comprising repeating the densifying step.

11. The method of claim 1, further comprising the step of repeating the depositing step.

12. The method of claim 7, further comprising repeating the depositing step.

13. The method of claim 1, wherein during the densifying step, the matrix material mimics the surface chemistry of the stoichiometric precursor layer.

14. The method of claim 1, wherein the depositing step is performed at a first temperature, and wherein the densifying step is performed at a second temperature greater than the first temperature.

15. The method of claim 1, wherein the depositing step is performed at a first pressure, and wherein the densifying step is performed at a second pressure greater than the first pressure.

* * * * *